United States Patent [19]

Volkert

[11] 4,090,654
[45] May 23, 1978

[54] APPARATUS FOR AUTOMATICALLY SOLDERING COMPONENTS TO PRINTED-CIRCUIT BOARDS

[75] Inventor: Willi Volkert, Nuremberg, Germany

[73] Assignee: Grundig E.M.V. Elektro-Mechanische Versuchsanstalt Max Grundig, Germany

[21] Appl. No.: 812,269

[22] Filed: Jul. 1, 1977

[30] Foreign Application Priority Data

Jul. 6, 1976 Germany .................. 7621287[U]

[51] Int. Cl.² .................. B23K 1/08; H05K 3/34
[52] U.S. Cl. .................. 228/40; 228/43; 228/259
[58] Field of Search .................. 228/40, 36, 43, 259

[56] References Cited

U.S. PATENT DOCUMENTS

| | | | |
|---|---|---|---|
| 2,292,117 | 8/1942 | Grimshaw | 228/259 |
| 3,386,166 | 6/1968 | Tardoskegyi | 228/36 X |
| 3,828,419 | 8/1974 | Wanner | 228/40 X |

Primary Examiner—Al Lawrence Smith
Assistant Examiner—K. J. Ramsey

[57] ABSTRACT

An apparatus for automatically soldering components to a printed-circuit board in accordance with the "drag bath" process wherein the board is moved through a lowered section with its undersurface in contact with a solder bath and withdrawn therefrom perpendicularly by lift means.

6 Claims, 2 Drawing Figures

APPARATUS FOR AUTOMATICALLY SOLDERING COMPONENTS TO PRINTED-CIRCUIT BOARDS

BACKGROUND OF THE INVENTION

There are two soldering processes which are generally accepted as useful in soldering components to printed-circuit boards. One is referred to as "wave soldering" and the other is referred to as "drag bath soldering".

In the "wave soldering" method, the printed-circuit board, to which components are to be attached by soldering, is carried over a wave of solder which is created by steady agitation of the fluid solder in a bath. A short but wide stationary wave of solder is created within the bath. The printed-circuit board is passed over the wave which splashes the board as it passes over the wave, touching it at its underside, in a line, which sweeps along the whole of its underside. The advantage of this method is, that a relatively small amount of heat is transferred to the printed-circuit board. A disadvantage of this method is that the fluid solder which has a tendency to oxidize, becomes oxided more quickly in view of the steady agitation.

In the "drag bath soldering" method, the bath of fluid solder remains relatively stationary. The printed-circuit board is dragged or pulled at low speed over the surface of the bath, where substantially its whole undersurface touches the fluid solder. At the end of its passage over the solder the board is pulled therefrom. As this occurs, small rearwardly directed slanted tails are drawn from each point of solder on the board. This is a serious disadvantage for the further processing of the soldered board.

SUMMARY OF THE INVENTION

The subject invention provides an apparatus, useful in the "drag bath soldering" process which will operate reliably despite the high temperature of the solder and which avoids the forming of the aforesaid small rearwardly slanted tails at the solder points.

In the subject invention transport frames are provided which are supported at both sides on two webbed straps. The straps slide in guide tracks which have sections for guiding the board down to and over the solder path. Means are provided for automatically raising the board vertically from the solder to the starting height.

DESCRIPTION OF THE INVENTION

Figure 1:
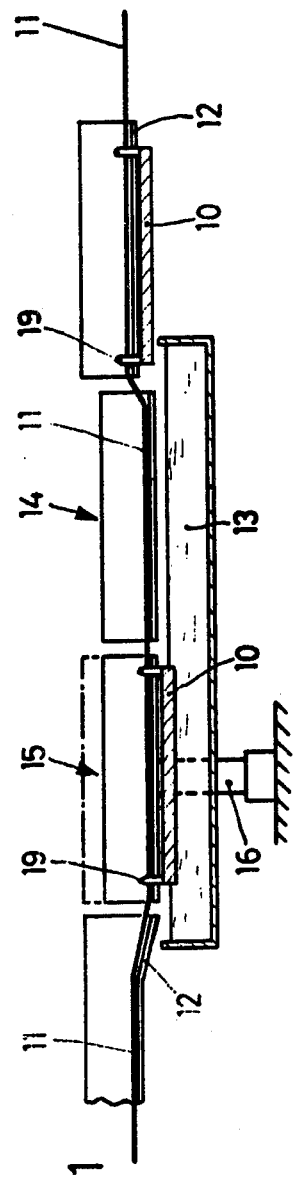
FIG. 1 is a sectional view of an apparatus for automatically soldering components to printed-circuit boards which is constructed in accordance with the teachings of this invention taken along the line 1—1 in the direction of the arrows in FIG. 2.
Figure 2:
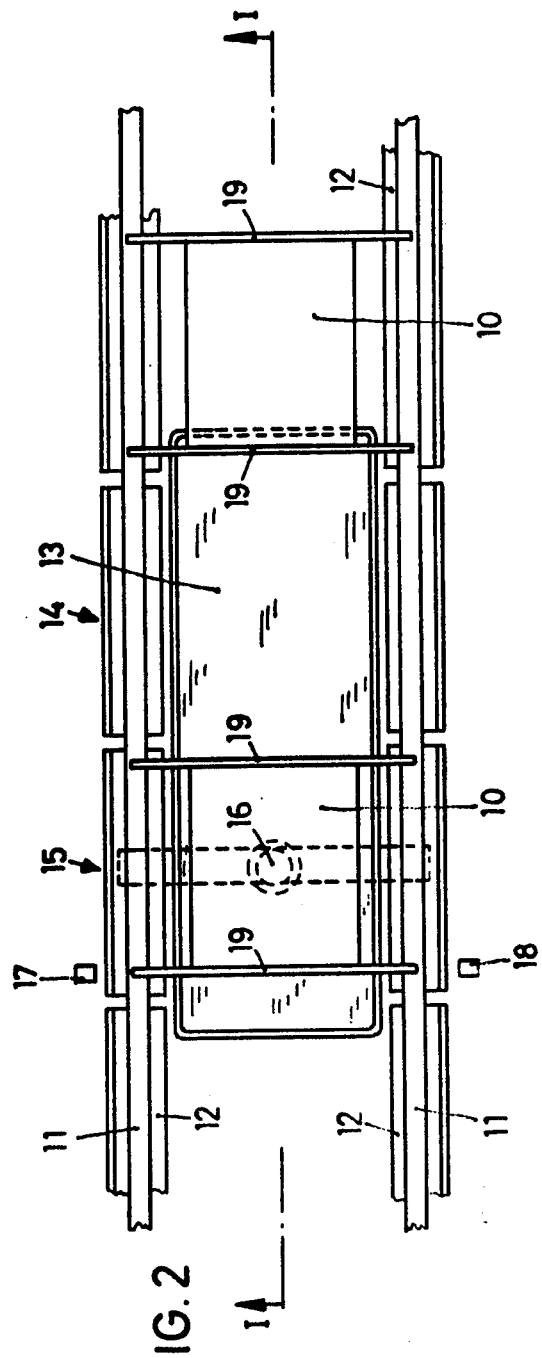
FIG. 2 is a top view of the apparatus.

An embodiment of the invention is shown in which printed-circuit boards, each of which is identified in the Figs. by the numeral 10, to which components are to be soldered are advanced by webbed straps 11 in guide tracks 12. The straps 11 support transport frames 19 which in turn support the boards 10 and movment of the straps from right to left in the Figs. moves the transports frames 19 and boards 10 from right to left. As seen in FIG. 2 the transport frames 19 extend transversely of the apparatus with a strap 11 on either side thereof.

The guide tracks in which the straps 11 are supported pass a solder bath 13. The tracks in the zone of the solder bath are lowered allowing the board to be soldered to become lowered so that its underside comes into contact with the upper surface of the solder as the board is pulled across the solder by means of the transport frame 19 and straps 11.

A lift section 15 of guide track 12, within which the board is still in contact with the solder bath, is provided wherein the board is lifted automatically and perpendicularly from contact with the solder bath as it has been moved near the end of the zone of the solder bath. The lifting can be accomplished in any suitable known manner, such as by hydraulic piston 16.

A part of the following guide track 12, not at the bath, is slanted downwardly at its beginning to receive the moving frame.

The perpendicular lifting of the printed-circuit board 10 from the surface of the solder bath 13 avoids the forming of the backwards slanted tails at the solder spots. This simplifies considerably the further processing of the printed-circuit board 10.

It is advantageous to make the webbed straps 11 from asbestos fibres or from heat stable plastic reinforced by glass fibres.

The initiation of the operation of the lift section 15 is accomplished by the transport frame itself by closing a contact switch. Such a contact switch can be operated in a known manner, it can be a mechanical contact or a light 17 can be interrupted, which influences an electro-optical sensor 18.

The double strap transport system enables a pressure-free movement of the transport frames 19 over the solder bath 13. The feeding sequence of the apparatus with loaded transport frames 19 can be selected as desired as long as the minimum distances and separations are maintained.

I claim:

1. An apparatus for soldering components to a printed-circuit board in accordance with the "drag bath soldering" process including in combination a solder bath, transport frames for supporting said printed-circuit board, straps supporting said transport frames on either side of said bath, guide tracks in which said straps are supported for movement of said transport frames over said bath, a lowered section of said guide tracks where the under surface of said printed-circuit board supported by said transport frames being moved through said section will be in contact with said bath, means for moving said straps whereby said transport frames will enter, move through and exit said lowered section, and a lift means for lifting said printed-circuit board perpendicularly from contact with said bath upon exiting said lowered section.

2. An apparatus in accordance with claim 1 in which the strap is webbed asbestos fibre.

3. An apparatus in accordance with claim 1 in which the strap is heat-stable plastic reinforced by glass fibres.

4. An apparatus in accordance with claim 1 in which the lift means is energized upon arrival of a transport frame at a switch position.

5. An apparatus in accordance with claim 4 in which the switch is electro-optically operated.

6. An apparatus in accordance with claim 1 in which the lift means is energized by manual operation of a switch.

* * * * *